US012802764B2

(12) United States Patent
Mencarelli

(10) Patent No.: US 12,802,764 B2
(45) Date of Patent: Nov. 17, 2026

(54) PROBE PAD DISCONNECTION FOR HIGH-SPEED MEMORY SYSTEM INTERFACES

(71) Applicant: Micron Technology, Inc., Boise, ID (US)

(72) Inventor: Manuel Mencarelli, Munich (DE)

(73) Assignee: Micron Technology, Inc., Boise, ID (US)

( * ) Notice: Subject to any disclaimer, the term of this patent is extended or adjusted under 35 U.S.C. 154(b) by 159 days.

(21) Appl. No.: 18/745,738

(22) Filed: Jun. 17, 2024

(65) Prior Publication Data

US 2024/0428869 A1 Dec. 26, 2024

Related U.S. Application Data

(60) Provisional application No. 63/521,991, filed on Jun. 20, 2023.

(51) Int. Cl.
*G11C 16/34* (2006.01)
*H10W 70/66* (2026.01)
*H10W 90/00* (2026.01)

(52) U.S. Cl.
CPC ......... *G11C 16/3418* (2013.01); *H10W 70/66* (2026.01); *H10W 90/701* (2026.01)

(58) Field of Classification Search
CPC . G11C 16/3418; H10W 70/66; H10W 90/701
See application file for complete search history.

(56) References Cited

U.S. PATENT DOCUMENTS 5,896,040 A * 4/1999 Brannigan ......... G01R 31/2884 324/762.02
6,054,334 A * 4/2000 Ma .......................... H01L 24/06 438/15
7,064,450 B1 * 6/2006 Eghan ..................... H01L 24/06 257/773
2003/0045013 A1 * 3/2003 Byrd .................. G01R 31/2856 438/16
2006/0267721 A1 * 11/2006 Graf ....................... H01C 7/126 337/297

* cited by examiner

*Primary Examiner* — Alexander Sofocleous
*Assistant Examiner* — Joseph Fidelis Stormes
(74) *Attorney, Agent, or Firm* — Holland & Hart LLP

(57) ABSTRACT

Methods, systems, and devices for probe pad disconnection for high-speed memory system interfaces are described. For example, a probe pad may be electrically connected with an operative signal path of a memory system interface via a conductor portion, and the conductor portion may be configured to deteriorate (e.g., melt, disconnect) after applying an electrical current through or a laser to the conductor portion (e.g., after performing evaluation operations via the probe pad). Such a deterioration may electrically disconnect the probe pad from the signal path, thereby reducing an effective capacitance of the signal path. In some examples, cross-sectional dimensions of the conductor portion, or material properties of the conductor portion, or both may support the probe pad being electrically disconnected from the signal path as a result of applying a current or a laser to the conductor portion.

20 Claims, 6 Drawing Sheets

PROBE PAD DISCONNECTION FOR HIGH-SPEED MEMORY SYSTEM INTERFACES

CROSS REFERENCE

The present application for patent claims priority to U.S. Patent Application No. 63/521,991 by Manuel Mencarelli, entitled "PROBE PAD DISCONNECTION FOR HIGH-SPEED MEMORY SYSTEM INTERFACES," filed Jun. 20, 2023, which is assigned to the assignee hereof, and which is expressly incorporated by reference in its entirety herein.

TECHNICAL FIELD

The following relates to one or more systems for memory, including probe pad disconnection for high-speed memory system interfaces.

BACKGROUND

Memory devices are used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored by the memory cell. To store information, a memory device may write (e.g., program, set, assign) states to the memory cells. To access stored information, a memory device may read (e.g., sense, detect, retrieve, determine) states from the memory cells.

DETAILED DESCRIPTION

Figure 1:
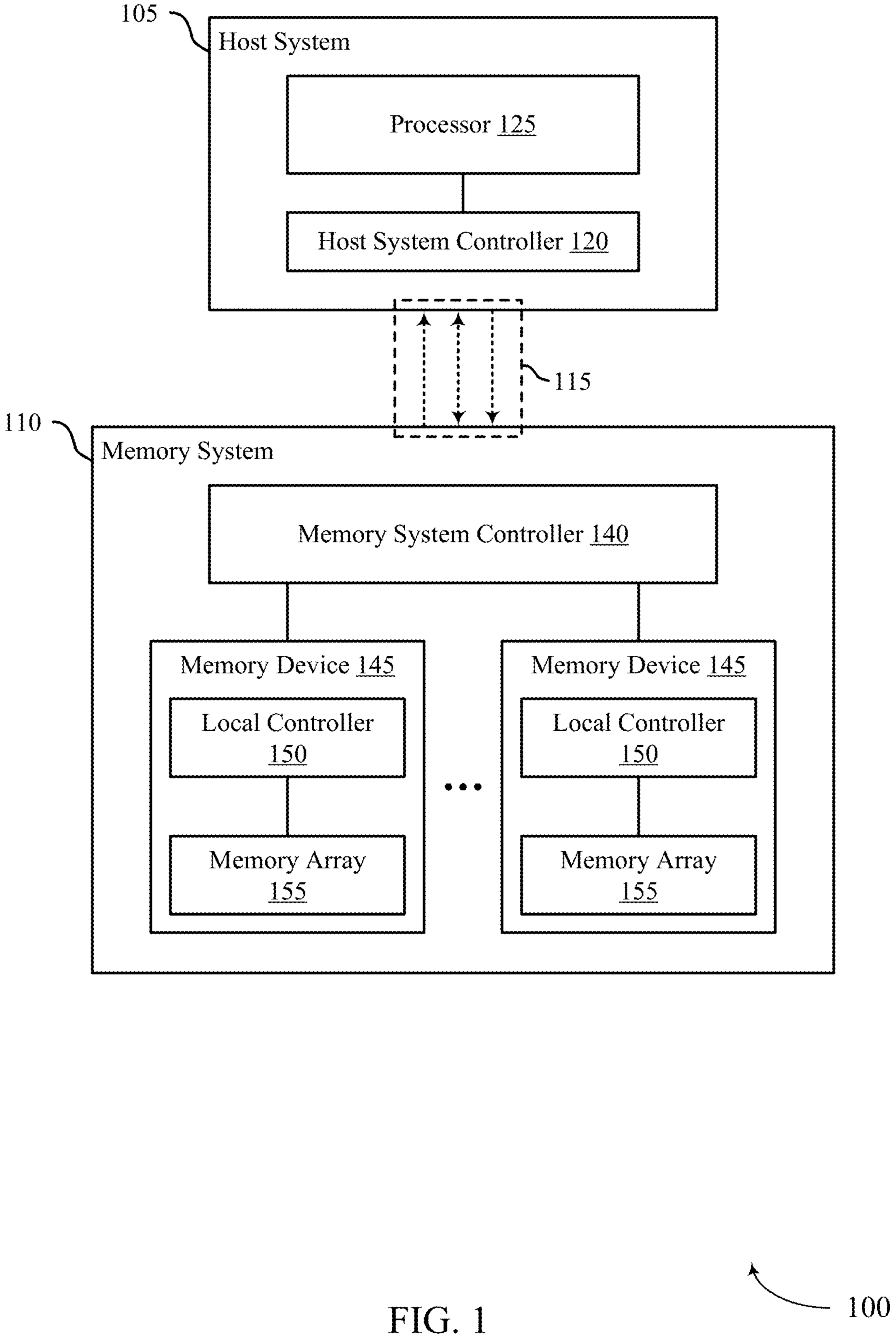
FIG. 1 shows an example of a system that supports probe pad disconnection for high-speed memory system interfaces in accordance with examples as disclosed herein.

In some semiconductor systems (e.g., memory systems, memory devices, memory dies), a conductive pad at a surface of a semiconductor component (e.g., a semiconductor wafer, a semiconductor die) may interface with circuitry that supports accessing a memory array via a signal path. For example, a pillar or other conductive feature of the signal path may couple with the conductive pad to convey signaling (e.g., to or from a host system) associated with accessing the memory array or otherwise operating the semiconductor component. In some cases, another pad (e.g., a probe pad) may be coupled with the signal path to support evaluating operations of the memory array, the access circuitry, or other circuitry of the semiconductor component. For example, a probe pad may be configured to enable communication between circuitry of the semiconductor component and an external device (e.g., an evaluation system, a tester) that may include a probe pin to contact the probe pad. As part of such evaluations, the probe pad may be deformed due to contact with the probe pin, which may render the probe pad unsuitable for assembly interconnection (e.g., fusing, soldering). The signal path may continue to support signaling via the other pad (e.g., an operative signaling pad), which may include high-frequency signaling. However, when a probe pad remains connected with an operative signaling pad, the probe pad may contribute to the intrinsic capacitance of the signal path, and may inhibit functionality of the signal path for high-frequency signaling. For example, the contribution of the probe pad to the intrinsic capacitance may increase a time constant associated with the signal path changing voltages related to different signaling values (e.g., bit values, modulation voltages), thereby limiting the ability of the signal path to support high-frequency signaling.

In accordance with examples as disclosed herein, a semiconductor component may implement techniques for mitigating or eliminating capacitive effects of a probe pad on a signal path. For example, a probe pad may be electrically connected with a signal path (e.g., with an operative pad) via a conductor portion that is configured to deteriorate (e.g., melt, disconnect) after applying an electrical current through or a laser to the conductor portion (e.g., after performing evaluation operations via the probe pad, acting as a fuse). Such a deterioration may electrically disconnect the probe pad from the signal path, thereby reducing an effective capacitance of the signal path. In some examples, cross-sectional dimensions of the conductor portion (e.g., a width along a surface of a semiconductor component, a thickness from the surface of the semiconductor component, or both) may support the probe pad being electrically disconnected from the signal path as a result of applying a current (e.g., due to relatively high current density at a relatively narrow conductor portion) or a laser to the conductor portion. Thus, the ability of the signal path to support high-speed signaling may be improved due to removing the contribution of the probe pad to signal path capacitance.

Features of the disclosure are illustrated and described in the context of systems and architectures. Features of the disclosure are further illustrated and described in the context of semiconductor components and flowcharts.

FIG. 1 illustrates an example of a system 100 that supports probe pad disconnection for high-speed memory system interfaces in accordance with examples as disclosed herein. The system 100 may include portions of an electronic device, such as a computing device, a mobile computing device, a wireless communications device, a graphics processing device, a vehicle, a smartphone, a wearable device, an internet-connected device, a vehicle controller, a system on a chip (SoC), or other stationary or portable electronic system, among other examples. The system 100 includes a host system 105, a memory system 110, and one or more channels 115 coupling the host system 105 with the memory system 110 (e.g., to support a communicative coupling). The system 100 may include any quantity of one or more memory systems 110 coupled with the host system 105.

The host system 105 may include one or more components (e.g., circuitry, processing circuitry, one or more processing components) that use memory to execute processes, any one or more of which may be referred to as or be included in a processor 125. The processor 125 may include at least one of one or more processing elements that may be co-located or distributed, including a general-purpose processor, a digital signal processor (DSP), an application-specific integrated circuit (ASIC), a field-programmable gate array (FPGA) or other programmable logic device, a controller, discrete gate or transistor logic, one or more discrete hardware components, or a combination thereof. The processor 125 may be an example of a central processing unit (CPU), a graphics processing unit (GPU), a general-purpose GPU (GPGPU), or an SoC or a component thereof, among other examples.

The host system 105 may also include at least one of one or more components (e.g., circuitry, logic, instructions) that implement the functions of an external memory controller (e.g., a host system memory controller), which may be referred to as or be included in a host system controller 120. For example, a host system controller 120 may issue commands or other signaling for operating the memory system 110, such as write commands, read commands, configuration signaling or other operational signaling. In some examples, the host system controller 120, or associated functions described herein, may be implemented by or be part of the processor 125. For example, a host system controller 120 may be hardware, instructions (e.g., software, firmware), or some combination thereof implemented by the processor 125 or other component of the host system 105. In various examples, a host system 105 or a host system controller 120 may be referred to as a host.

The memory system 110 provides physical memory locations (e.g., addresses) that may be used or referenced by the system 100. The memory system 110 may include a memory system controller 140 and one or more memory devices 145 (e.g., memory packages, memory dies, memory chips) operable to store data. The memory system 110 may be configurable for operations with different types of host systems 105, and may respond to commands from the host system 105 (e.g., from a host system controller 120). For example, the memory system 110 (e.g., a memory system controller 140) may receive a write command indicating that the memory system 110 is to store data received from the host system 105, or receive a read command indicating that the memory system 110 is to provide data stored in a memory device 145 to the host system 105, or receive a refresh command indicating that the memory system 110 is to refresh data stored in a memory device 145, among other types of commands and operations.

A memory system controller 140 may include at least one of one or more components (e.g., circuitry, logic, instructions) operable to control operations of the memory system 110. A memory system controller 140 may include hardware or instructions that support the memory system 110 performing various operations, and may be operable to receive, transmit, or respond to commands, data, or control information related to operations of the memory system 110. A memory system controller 140 may be operable to communicate with one or more of a host system controller 120, one or more memory devices 145, or a processor 125. In some examples, a memory system controller 140 may control operations of the memory system 110 in cooperation with the host system controller 120, a local controller 150 of a memory device 145, or any combination thereof. Although the example of memory system controller 140 is illustrated as a separate component of the memory system 110, in some examples, aspects of the functionality of the memory system 110 may be implemented by a processor 125, a host system controller 120, at least one of one or more local controllers 150, or any combination thereof.

Each memory device 145 may include a local controller 150 and one or more memory arrays 155. A memory array 155 may be a collection of memory cells (e.g., a two-dimensional array, a three-dimensional array), with each memory cell being operable to store data (e.g., as one or more stored bits). Each memory array 155 may include memory cells of various architectures, such as random access memory (RAM) cells, dynamic RAM (DRAM) cells, synchronous dynamic RAM (SDRAM) cells, static RAM (SRAM) cells, ferroelectric RAM (FeRAM) cells, magnetic RAM (MRAM) cells, resistive RAM (RRAM) cells, phase change memory (PCM) cells, chalcogenide memory cells, not-or (NOR) memory cells, and not-and (NAND) memory cells, or any combination thereof.

A local controller 150 may include at least one of one or more components (e.g., circuitry, logic, instructions) operable to control operations of a memory device 145. In some examples, a local controller 150 may be operable to communicate (e.g., receive or transmit data or commands or both) with a memory system controller 140. In some examples, a memory system 110 may not include a memory system controller 140, and a local controller 150 or a host system controller 120 may perform functions of a memory system controller 140 described herein. In some examples, a local controller 150, or a memory system controller 140, or both may include decoding components operable for accessing addresses of a memory array 155, sense components for sensing states of memory cells of a memory array 155, write components for writing states to memory cells of a memory array 155, or various other components operable for supporting described operations of a memory system 110.

A host system 105 (e.g., a host system controller 120) and a memory system 110 (e.g., a memory system controller 140) may communicate information (e.g., data, commands, control information, configuration information) using one or more channels 115. Each channel 115 may be an example of a transmission medium that carries information, and each channel 115 may include one or more signal paths (e.g., a transmission medium, an electrical conductor, a conductive path) between terminals (e.g., nodes, pins, contacts) associated with the components of the system 100. A terminal may be an example of a conductive input or output point of a device of the system 100, and a terminal may be operable as part of a channel 115. To support communications over channels 115, a host system 105 (e.g., a host system controller 120) and a memory system 110 (e.g., a memory system controller 140) may include receivers (e.g., latches) for receiving signals, transmitters (e.g., drivers) for transmitting signals, decoders for decoding or demodulating received signals, or encoders for encoding or modulating signals to be transmitted, among other components that support signaling over channels 115, which may be included in a respective interface portion of the respective system.

A channel 115 be dedicated to communicating one or more types of information, and channels 115 may include unidirectional channels, bidirectional channels, or both. For example, the channels 115 may include one or more command/address channels, one or more clock signal channels, one or more data channels, among other channels or combinations thereof. In some examples, a channel 115 may be configured to provide power from one system to another (e.g., from the host system 105 to the memory system 110, in accordance with a regulated voltage). In some examples, at least a subset of channels 115 may be configured in accordance with a protocol (e.g., a logical protocol, a communications protocol, an operational protocol, an industry standard), which may support configured operations of and interactions between a host system 105 and a memory system 110.

A command/address channel (e.g., a CA channel) may be operable to communicate commands between the host system 105 and the memory system 110, including control information associated with the commands (e.g., address information, configuration information). Commands carried by a command/address channel may include a write command with an address for data to be written to the memory system 110 or a read command with an address of data to be read from the memory system 110.

A clock signal channel may be operable to communicate one or more clock signals between the host system 105 and the memory system 110. Clock signals may oscillate between a high state and a low state, and may support coordination (e.g., in time) between operations of the host system 105 and the memory system 110. In some examples, a clock signal may provide a timing reference for operations of the memory system 110. A clock signal may be referred to as a control clock signal, a command clock signal, or a system clock signal. A system clock signal may be generated by a system clock, which may include one or more hardware components (e.g., oscillators, crystals, logic gates, transistors).

A data channel (e.g., a DQ channel) may be operable to communicate (e.g., bidirectionally) information (e.g., data, control information) between the host system 105 and the memory system 110. For example, a data channel may communicate information from the host system 105 to be written to the memory system 110, or information read from the memory system 110 to the host system 105. In some examples, channels 115 may include one or more error detection code (EDC) channels. An EDC channel may be operable to communicate error detection signals, such as checksums or parity bits, which may accompany information conveyed over a data channel.

In some cases, one or more components of the system 100 (e.g., a memory system 110, a memory system controller 140, one or more memory devices 145, a host system 105, a processor 125, a host system controller 120) may be implemented as a semiconductor component, such as a semiconductor die separated from a semiconductor wafer. For example, a memory system 110 or a memory device 145 may be formed as a semiconductor die (e.g., a memory die) that is separated from a wafer of such dies. However, the described techniques may be implemented in other types of semiconductor components, including those that implement other portions of the system 100.

In examples of a semiconductor component that implements aspects of a memory system 110, a conductive pad at a surface of the semiconductor (e.g., a terminal of a channel 115, a terminal of a signal path for communication between a memory system controller 140 and a memory device 145) may interface with circuitry (e.g., a memory system controller 140, a local controller 150) that supports accessing a memory array 155 via a signal path. For example, a pillar or other conductive feature of the signal path may couple with the conductive pad to convey signaling (e.g., between a host system 105 and a memory system 110, between a memory system controller 140 and a memory device 145) associated with accessing the memory array 155 or otherwise operating the semiconductor component.

In some cases, another pad (e.g., a probe pad) may be coupled with the signal path to support evaluating operations of the memory array 155, the access circuitry, or other circuitry of the semiconductor component. For example, a probe pad may be configured to enable communication between circuitry of the semiconductor component and an external device (e.g., an evaluation system, a tester) that may include a probe pin to contact the probe pad. As part of such evaluations, the probe pad may be deformed due to contact with the probe pin, which may render the probe pad unsuitable for assembly interconnection (e.g., fusing, soldering). The signal path may continue to support signaling via the other pad (e.g., an operative signaling pad), which may include high-frequency signaling. However, when a probe pad remains connected with an operative signaling pad, the probe pad may contribute to the intrinsic capacitance of the signal path, and may inhibit functionality of the signal path for high-frequency signaling. For example, the contribution of the probe pad to the intrinsic capacitance may increase a time constant associated with the signal path changing voltages related to different signaling values (e.g., bit values, modulation voltages, driver voltages), thereby limiting the ability of the signal path to support high-frequency signaling.

In accordance with examples as disclosed herein, a semiconductor component (e.g., that implements one or more aspects of a memory system 110, that implements one or more aspects of a memory device 145, that implements one or more aspects of a host system 105) may implement techniques for mitigating or eliminating capacitive effects of a probe pad on a signal path. For example, one or more probe pads may be electrically connected with respective signal paths (e.g., with an operative pad) via a respective conductor portion that is configured to deteriorate (e.g., melt, disconnect) after applying an electrical current through or a laser to the conductor portion (e.g., after performing evaluation operations via the probe pad, acting as a fuse). Such a deterioration may electrically disconnect a probe pad from a signal path, thereby reducing an effective capacitance of the signal path. In some examples, cross-sectional dimensions of the conductor portion (e.g., a width along a surface of a semiconductor component, a thickness from the surface of the semiconductor component, or both) may support the probe pad being electrically disconnected from the signal path as a result of applying a current (e.g., due to relatively high current density at a relatively narrow conductor portion) or a laser to the conductor portion. Thus, the ability of the signal path to support high-speed signaling may be improved due to removing the contribution of the probe pad to signal path capacitance.

In addition to applicability in systems as described herein, techniques for probe pad disconnection for high-speed memory system interfaces may be generally implemented in semiconductor components to improve the performance (including gaming) of various electronic devices and systems. Some electronic device applications, including gaming and other high-performance applications, may be associated with relatively high processing requirements while also benefitting from relatively quick response times to improve user experience. As such, increasing processing speed, decreasing response times, or otherwise improving the performance electronic devices may be desirable. Implementing the techniques described herein may improve the performance of semiconductor components by improving the support of high-frequency signaling operations, which may decrease processing or latency times, improve response times, or otherwise improve user experience, among other benefits.

Figure 2:
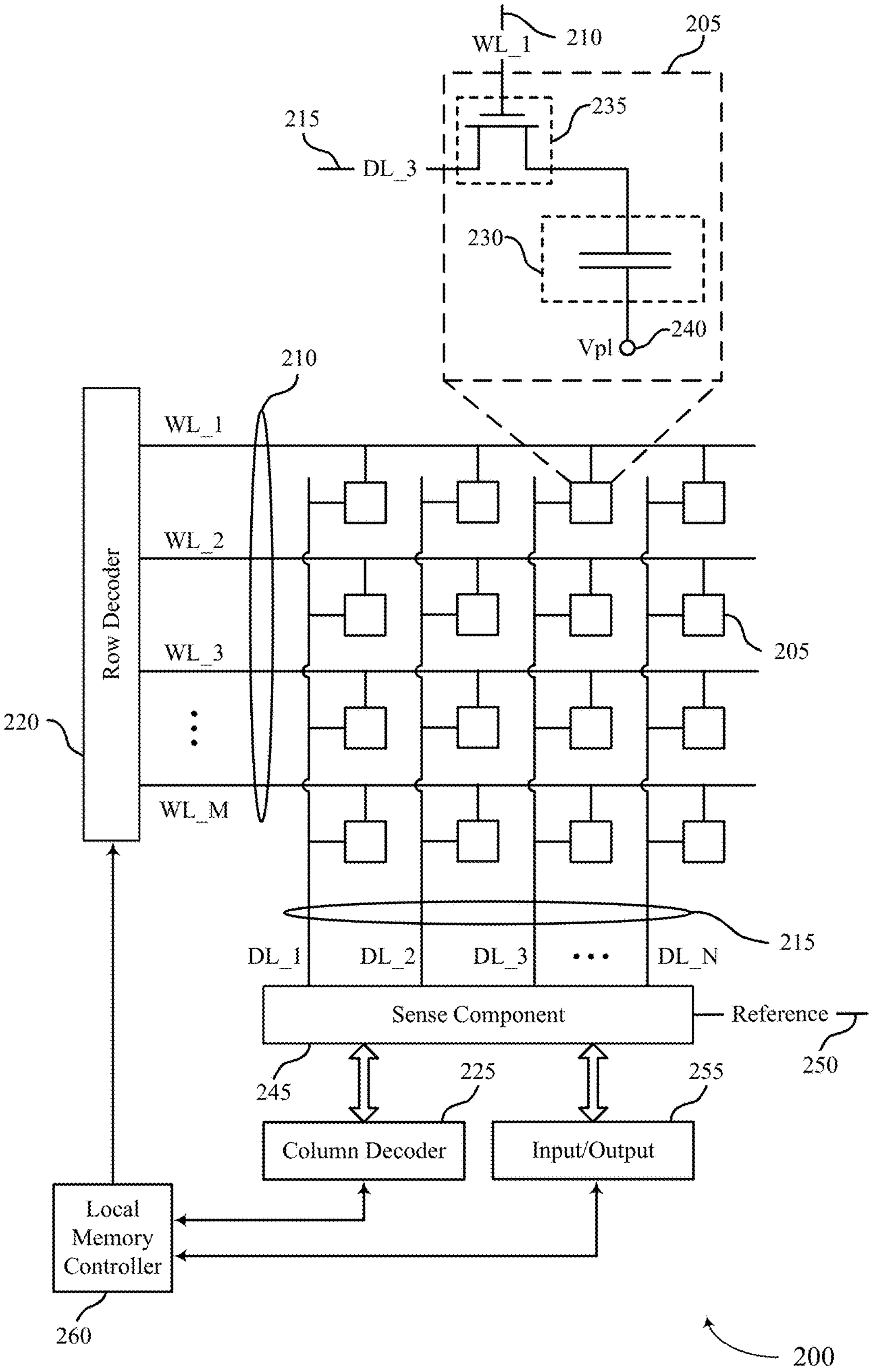
FIG. 2 shows an example of an architecture that supports probe pad disconnection for high-speed memory system interfaces in accordance with examples as disclosed herein.

FIG. 2 illustrates an example of an architecture 200 (e.g., a memory architecture) that supports probe pad disconnection for high-speed memory system interfaces in accordance with examples as disclosed herein. The architecture 200 may be implemented in a memory system 110 or one or more components thereof (e.g., memory device 145). Aspects of the memory architecture 200 may be referred to as or implemented in a semiconductor component, such as a memory die.

The architecture 200 includes memory cells 205 that are programmable to store information. In some examples, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). Memory cells 205 may be arranged in an array, such as in a memory array 155.

In the example of architecture 200, a memory cell 205 may include a storage component, such as capacitor 230, and a selection component 235 (e.g., a cell selection component, a transistor). A capacitor 230 may be a dielectric capacitor or a ferroelectric capacitor. A node of the capacitor 230 may be coupled with a voltage source 240, which may be a cell plate reference voltage, such as Vp1, or may be a ground voltage, such as Vss. A charge stored by a memory cell 205 (e.g., by a capacitor 230) may be representative of a programmed state. Other memory architectures that support the techniques described herein may implement different types or arrangements of storage components and associated circuitry (e.g., with or without a selection component).

The architecture 200 may include various arrangements of access lines, such as word lines 210 and digit lines 215. An access line may be a conductive line that is coupled with a memory cell 205, and may be used to perform access operations on the memory cell 205. Word lines 210 may be referred to as row lines, and digit lines 215 may be referred to as column lines or bit lines, among other nomenclature. Memory cells 205 may be positioned at intersections of access lines, and an intersection may be referred to as an address of a memory cell 205.

In some architectures, a word line 210 may be coupled with a gate of a selection component 235 of a memory cell 205, and may be operable to control (e.g., switch, modulate a conductivity of) the switching component 235. A digit line 215 may be operable to couple a memory cell 205 with a sense component 245. In some architectures, a memory cell 205 (e.g., a capacitor 230) may be coupled with a digit line 215 during portions of an access operation. For example, a word line 210 and a selection component 235 of a memory cell 205 may be operable to couple or isolate a capacitor 230 of the memory cell 205 with a digit line 215.

Operations such as reading and writing may be performed on memory cells 205 by activating (e.g., applying a voltage to) access lines such as a word line 210 or a digit line 215. Accessing the memory cells 205 may be controlled through a row decoder 220, or a column decoder 225, or a combination thereof. For example, a row decoder 220 may receive a row address (e.g., from a local memory controller 260) and activate a word line 210 based on a received row address, and a column decoder 225 may receive a column address and activate a digit line 215 based on a received column address. Selecting or deselecting a memory cell 205 may include activating or deactivating a selection component 235 using a word line 210. For example, a capacitor 230 may be isolated from a digit line 215 when the switching component 235 is deactivated, and the capacitor 230 may be coupled with the digit line 215 when the switching component 235 is activated.

A sense component 245 may be operable to detect a state (e.g., a charge) stored by a capacitor 230 of a memory cell 205 and determine a logic state of the memory cell 205 based on the stored state. A sense component 245 may include one or more sense amplifiers to amplify or otherwise convert a signal resulting from accessing the memory cell 205. The sense component 245 may compare a signal detected from the memory cell 205 with a reference 250 (e.g., a reference voltage). The detected logic state of the memory cell 205 may be provided as an output of the sense component 245 (e.g., via an input/output 255), and may indicate the detected logic state to another component of a memory system 110 that implements the architecture 200.

The local memory controller 260 may control the accessing of memory cells 205 through the various components (e.g., a row decoder 220, a column decoder 225, a sense component 245), and may be an example of or otherwise included in a local controller 150, or a memory system controller 140, or both. In some examples, one or more of a row decoder 220, a column decoder 225, and a sense component 245 may be co-located with or included in the local memory controller 260. The local memory controller 260 may be operable to receive commands or data from one or more different controllers (e.g., a host system controller 120, a memory system controller 140), translate the commands or the data into information that can be used by the architecture 200, initiate or control one or more operations of the architecture 200, and communicate data from the architecture 200 to a host (e.g., a host system 105) based on performing the one or more operations.

The local memory controller 260 may be operable to perform one or more access operations on one or more memory cells 205 of the architecture 200. Examples of an access operation may include a write operation, a read operation, a refresh operation, a precharge operation, or an activate operation, among others. In some examples, an access operation may be performed by or otherwise coordinated by the local memory controller 260 in response to one or more access commands (e.g., from a host system 105). The local memory controller 260 may be operable to perform other access operations not listed here or other operations related to the operating of the architecture 200 that are not directly related to accessing the memory cells 205.

In some examples, a semiconductor component (e.g., a semiconductor die, a semiconductor wafer) that includes aspects of the architecture 200 may implement techniques for mitigating or eliminating capacitive effects of a probe pad on a signal path. For example, one or more probe pads may be electrically connected with respective signal paths (e.g., with respective operative pads configured for signaling with a local memory controller 260) via a respective conductor portion that is configured to deteriorate (e.g., melt, disconnect) after applying an electrical current through or a laser to the conductor portion (e.g., after performing evaluation operations via the probe pad, acting as a fuse). Such a deterioration may electrically disconnect probe pads from the respective signal paths, thereby reducing an effective capacitance of the signal paths. Thus, the ability of the signal paths to support high-speed signaling may be improved due to removing the contribution of the probe pad to signal path capacitance.

Figure 3:
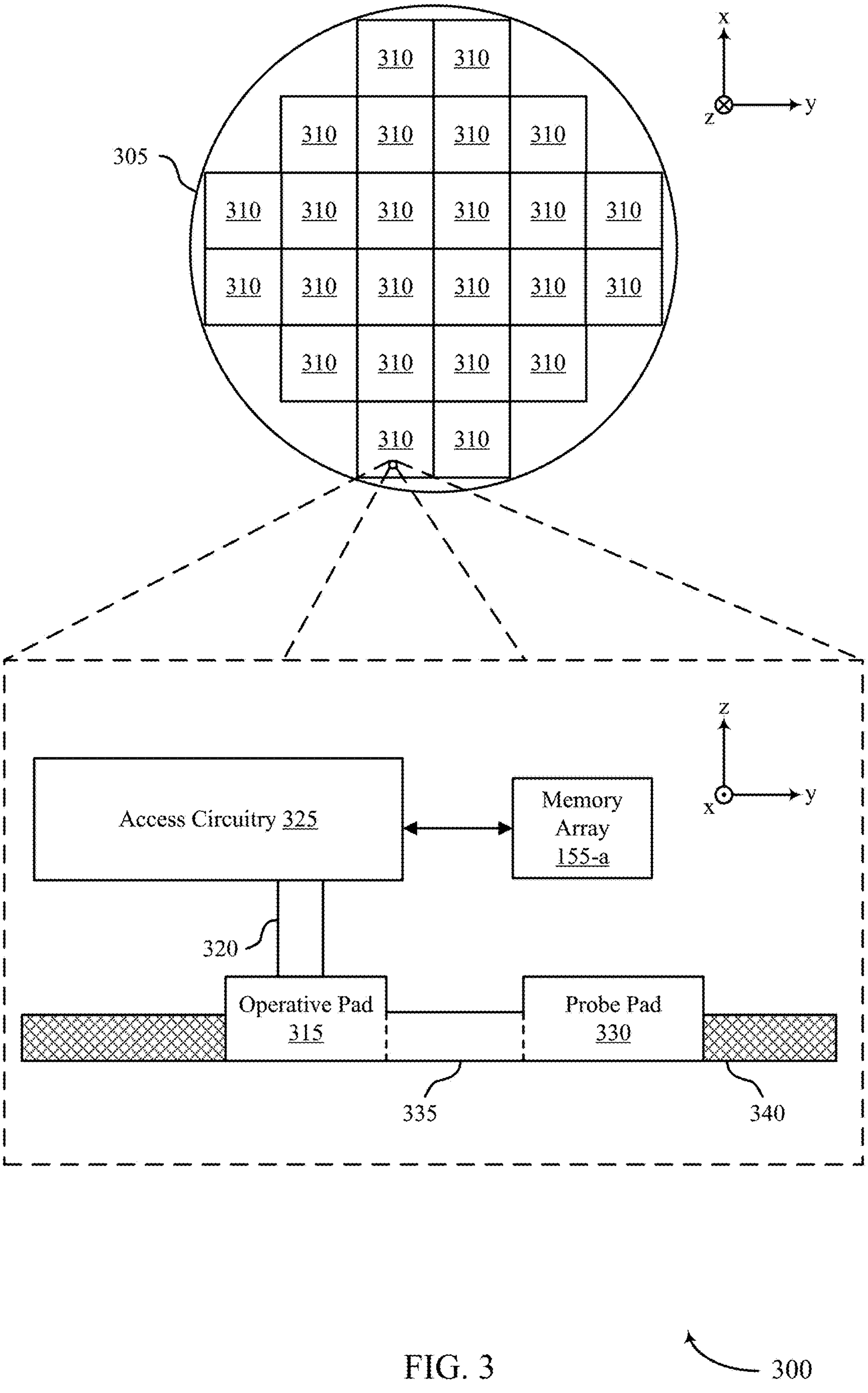
FIG. 3 shows an example of a semiconductor system that supports probe pad disconnection for high-speed memory system interfaces in accordance with examples as disclosed herein.

FIG. 3 shows an example of a semiconductor system 300 that supports probe pad disconnection for high-speed memory system interfaces in accordance with examples as disclosed herein. The semiconductor system 300 includes a wafer 305 (e.g., a semiconductor wafer), portions of which may be divided among any quantity of dies 310 (e.g., semiconductor dies), where a wafer 305 or a die 310 may be an example of a semiconductor component in accordance with examples as disclosed herein. In some examples, a die 310 may implement aspects of a system 100, or an architecture 200, or both. For example, a die 310 may implement aspects of a memory system 110, or a component thereof (e.g., a memory system controller 140, a memory device 145), or a host system 105, or a component thereof (e.g., a processor 125, a host system controller 120), among other implementations of a semiconductor component. Aspects of the semiconductor system 300 may be described with reference to an x-direction (e.g., a direction along or parallel to a surface of the wafer 305), a y-direction (e.g., a direction along or parallel to a surface of the wafer 305), and a z-direction (e.g., a direction away from a surface of the wafer 305, a thickness direction) of the illustrated coordinate system.

In some examples, a wafer 305 may include a section of a semiconductor material that is round in an xy-plane (e.g., a circular slice of a cylindrical boule of crystalline semiconductor, such as crystalline silicon) that provides a substrate suitable for the fabrication of semiconductor devices (e.g., on one or both surfaces of the wafer 305). In some implementations, one or more dies 310 may be separated (e.g., cut, cleaved, snapped) from the wafer 305. For example, if the wafer 305 includes multiple sets of integrated circuits (e.g., similar or dissimilar circuits, circuits dedicated to respective dies 310), the one or more dies 310 may be separated such that each die 310 includes a respective set of integrated circuits.

Circuitry of a semiconductor component (e.g., a wafer 305, a die 310) may be accessed via conductive pads at a surface 340 of the semiconductor component (e.g., before or after separating dies 310 from a wafer 305). For example, a semiconductor component that implements aspects of a memory system 110 or an architecture 200 may include a memory array 155-*a* and access circuitry 325 (e.g., circuitry configured for accessing the memory array 155-*a*), which may include aspects of a memory system controller 140, a local controller 150, a local memory controller 260, a row decoder 220, a column decoder 225, a sense component 245, an input/output 255, or other examples of access circuitry. The semiconductor component may also include one or more operative pads 315 (e.g., one or more first conductive pads) at the surface 340 that are electrically connected with the access circuitry 325 (e.g., via a signal path 320, which may extend at least in part along the z-direction, such as via a pillar). In various examples, a semiconductor component may include any quantity of one or more instances of circuitry (e.g., access circuitry 325), each of which may be coupled with any quantity of one or more operative pads 315 via a respective signal path 320.

An operative pad 315 may provide an interconnection point for a communication path between the semiconductor component and another component (e.g., a printed circuit board, another semiconductor component), such as in an assembled product. For example, the operative pads 315 may be configured to convey command signaling, data signaling, clock signaling, or any combination thereof, among other types of signaling, between the semiconductor component and another component that is configured to couple with the operative pads 315. In some examples, operative pads 315 and respective signal paths 320 may be configured to convey relatively high-speed (e.g., high frequency) signaling.

A semiconductor component may also include one or more probe pads 330 (e.g., a second conductive pad), which may be configured to support evaluation of various operations of the semiconductor component. In some examples, a probe pad 330 may provide a temporary interconnection point to enable communication between the semiconductor component and an external device (e.g., an evaluation system, a tester) for such evaluations. For example, as part of evaluating a semiconductor component, a probe pin may contact one or more probe pads 330 to electrically connect (e.g., temporarily couple) an external device and circuitry of the semiconductor component. In some cases, to support contacting probe pads 330 with probe pins, one or more probe pads 330 may have a relatively larger cross-sectional area (e.g., along the surface 340, in an xy-plane) than operative pads 315, and may be located relatively far from other probe pads 330 (e.g., associated with other operative pads 315 of the semiconductor component).

In some examples, probe pads 330 may be configured to support evaluations via respective signal paths 320 (e.g., to evaluate circuitry operations, such as operations of access circuitry 325 or a memory array 155-*a*, before or after dies 310 are separated from one another), and thus may be electrically connected with one or more of the operative pads 315 (e.g., all of the operative pads 315, fewer than all of the operative pads 315) of the semiconductor component. For example, a probe pad 330 may be electrically connected with an operative pad 315 via a conductor portion 335. In some examples, an operative pad 315, a conductor portion 335, and a probe pad 330 may be formed from a contiguous conductor material, which may be contiguous at the surface 340 or may have a contiguous portion that is beneath the surface 340. In some other examples, a conductor portion 335 may be formed of a different material than one or both of the coupled operative pad 315 and probe pad 330.

In some examples, one or more probe pads 330 may be damaged due to contact with respective probe pins. For example, a surface of a probe pad 330 may be deformed (e.g., having a material irregularity) after evaluating the semiconductor component, which may render the probe pad 330 unsuitable for interconnection assembly, such as fusing or soldering operations. Despite losing interconnection functionality after evaluating the semiconductor component, probe pads 330 may remain electrically connected with operative pads 315 via respective conductor portions 335. Accordingly, probe pads 330 may impose capacitive effects on signal paths 320 due to remaining connected with operative pads 315. For instance, a probe pad 330 may contribute to (e.g., increase) an intrinsic capacitance of a signal path 320, which may increase a time constant associated with the signal path 320 changing voltages related to different signaling values (e.g., bit values, modulation values, driver voltages). Such an increase of the time constant may limit the ability of the signal path 320 to support high-frequency signaling, such as between operative pads 315 and access circuitry 325, or between access circuitry 325 and a component coupled with the semiconductor component (e.g., a driver or latch that communicates signaling via the signal path 320).

To reduce or eliminate capacitive effects of a probe pad 330 on a respective signal path 320, a conductor portion 335 may be configured to deteriorate (e.g., melt, disconnect) after applying an electrical current through or a laser to the conductor portion 335, which may involve the conductor portion operating as or being referred to as a fuse (e.g., a fused connection between an operative pad 315 and a probe pad 330). For example, a width of a conductor portion 335 (e.g., along the surface 340, along the x-direction), or a thickness of the conductor portion 335 (e.g., from the surface 340, along the z-direction), or both may be relatively smaller than respective widths, thicknesses, or both of the operative pad 315 and the probe pad 330. Such a configuration may enable the conductor portion 335 to be melted via an electrical current (e.g., due to increased current density through the conductor portion 335) or by applying a laser, thereby electrically disconnecting the probe pad 330 from the operative pad 315 (e.g., acting as a fuse to remove a contribution of the probe pad 330 to a net capacitance associated with communications via the corresponding signal path 320)

Figure 4A:
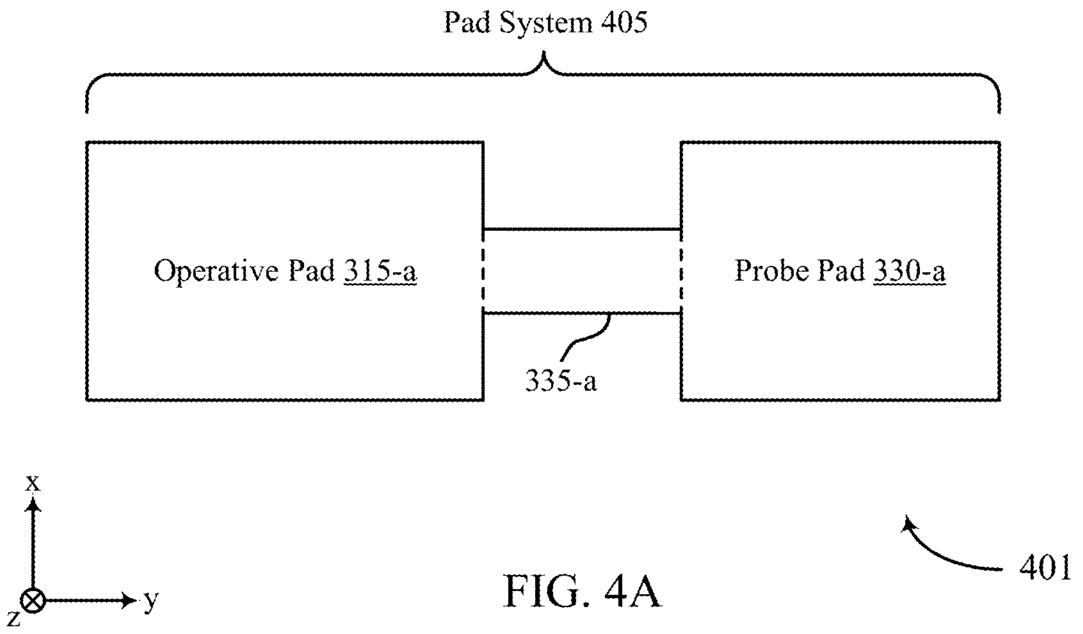
FIGS. 4A and 4B show examples of a pad system that support probe pad disconnection for high-speed memory system interfaces in accordance with examples as disclosed herein.
Figure 4B:
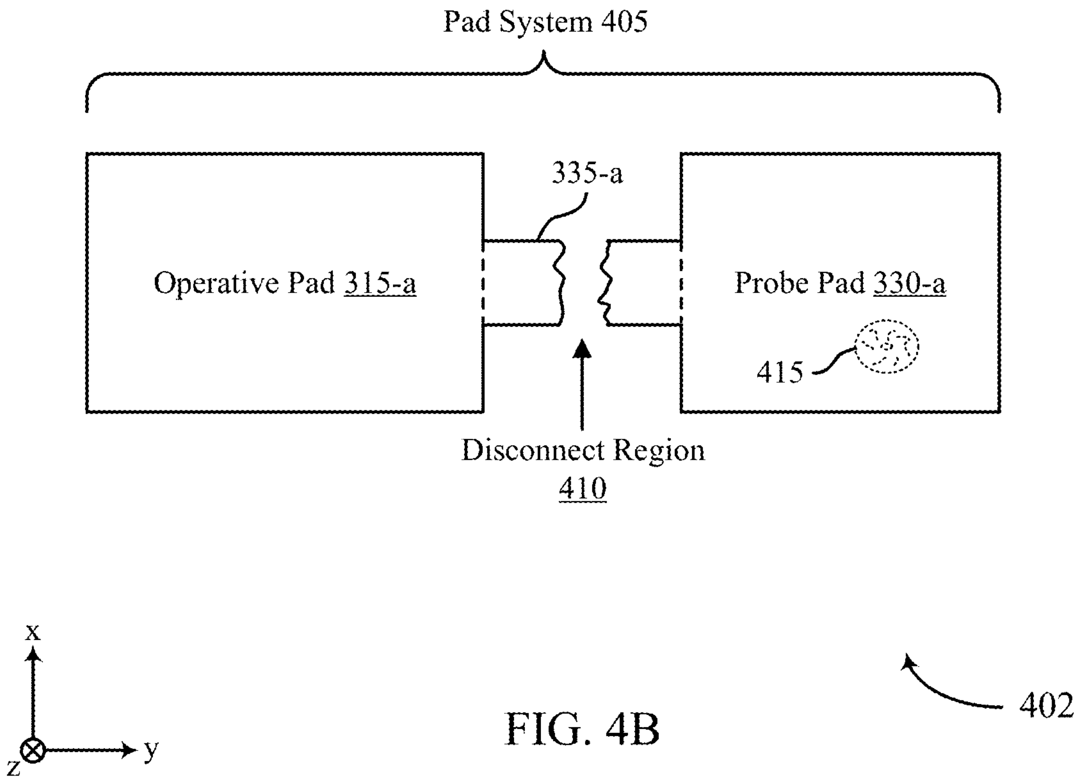

FIGS. 4A and 4B show examples 401 and 402 of a pad system 405 that supports probe pad disconnection for high-speed memory system interfaces in accordance with examples as disclosed herein. The pad system 405 may be implemented in any quantity of one or more instances in a semiconductor component (e.g., a wafer 305, a die 310), and may include an operative pad 315-*a*, a probe pad 330-*a*, and a conductor portion 335-*a* between the operative pad 315-*a* and the probe pad 330-*a*. Aspects of the pad system 405 may be described with reference to an x-direction, a y-direction, and a z-direction of the illustrated coordinate system, which may be the same as or different than the respective directions of the semiconductor system 300. The example 401 and the example 402 may illustrate the pad system before and after melting the conductor portion 335-*a*, respectively.

The operative pad 315-*a* may couple with circuitry of the semiconductor component (e.g., access circuitry 325, via a signal path 320, to support accessing a memory array 155-*a*, not shown). In some cases, the probe pad 330-*a* may enable a connection between the circuitry of the semiconductor component and an external device (e.g., an evaluation system) to support evaluating operations of the semiconductor component (e.g., wafer evaluations, die evaluations). In some cases, the operative pad 315-*a* may have a first cross-sectional area at a surface (e.g., a surface 340, in an xy-plane) of the semiconductor component and the probe pad 330-*a* may have a second cross-sectional area at the surface of the semiconductor component that is different than the first cross-sectional area. For example, an exposed footprint of the operative pad 315-*a* may be smaller than or larger than a footprint of the probe pad 330-*a*.

To enable evaluating at least some of the circuitry of the semiconductor component (e.g., via a signal path 320 coupled with the operative pad 315-*a*) via the probe pad 330-*a*, the operative pad 315-*a* and the probe pad 330-*a* may be electrically connected by a conductor portion 335-*a*. As part of such evaluation, a portion 415 of the probe pad 330-*a* may be damaged due to contact with a probe pin, which may be associated with a material irregularity (e.g., an indentation, a surface roughness, a material separation, a material dislocation, a plastic deformation). Damage of the portion 415 may render the probe pad 330-*a* unsuitable for interconnection in an assembly operation, which may necessitate such interconnection to be implemented via the operative pad 315-*a*. However, when the probe pad 330-*a* remains electrically connected with the operative pad 315-*a* (e.g., via the conductor portion 335-*a*), the probe pad 330-*a* may contribute to an intrinsic capacitance of the signal path 320 coupled with the operative pad 315-*a*, which may limit the ability of the signal path 320 to support relatively high frequency signals. For example, capacitive effects of the probe pad 330-*a* may increase a time constant associated with the signal path 320 changing voltages related to different signaling values (e.g., bit values, modulation values, or the like), thereby limiting the ability of the signal path 320 to support high-frequency signaling.

To reduce or eliminate capacitive effects of the probe pad 330-*a* on signaling carried via the operative pad 315-*a*, the conductor portion 335-*a* may be configured to deteriorate after applying an electrical current through or a laser to the conductor portion 335-*a* (e.g., to disconnect the probe pad 330-*a* from the operative pad 315-*a*). For example, applying a current through the conductor portion 335-*a* or applying a laser to the conductor portion 335-*a* may melt at least a portion of the conductor portion 335-*a* to form a disconnect region 410 (e.g., a physical disconnection, an electrical disconnection, a molten disconnection region, an opened electrical connection, acting as a fuse), as illustrated by the example 402. In some examples, after forming a disconnect region 410, the operative pad 315-*a* and a first portion of the conductor portion 335-*a* may be a first contiguous conductor material, and the probe pad 330-*a* and a second portion of the conductor portion 335-*a* may be a second contiguous conductor material (e.g., separated by the disconnect region 410.

In some examples of deteriorating the conductor portion 335-*a*, an electrical current may be applied via the probe pad 330-*a*. For example, a relatively high voltage may be applied to the probe pad 330-*a*, which may connect (e.g., temporarily connect via an activated switch or transistor) to another pad with a relatively low voltage (e.g., a ground pad, another probe pad 330, not shown) to support a current flowing through the conductor portion 335-*a*. In some examples, a burst charge may be applied to the probe pad 330-*a* to drive current though the conductor portion 335-*a*, which may flow into an intrinsic capacitance associated with the probe pad 330-*a* (e.g., into the semiconductor component) without a return path for the current to flow outside the semiconductor component. In some examples, a voltage may be applied to the probe pad 330-*a* to drive a current through the conductor portion 335-*a*, and a return path may be supported via another pad (e.g., an operative pad 315-*a*) in a manner that avoids physical damage to the other pad, such as when a current to deteriorate the conductor portion 335-*a* is returned across a gap (e.g., as an arcing current) between the other pad and a voltage or current source (e.g., a ground conductor of an evaluation system). In some other examples, a laser may be applied to the conductor portion 335-*a*, and a corresponding melting of or removal of (e.g., vaporization of, ablation of) a material of the conductor portion 335-*a* may break an electrical continuity between the probe pad 330-*a* and the operative pad 315-*a*.

In some cases, one or more dimensions of a cross-sectional area (e.g., a conductive cross-section in an xz-plane, perpendicular to a conductive direction along the y-direction) of the conductor portion 335-*a* may support disconnecting the probe pad 330-*a* from the operative pad 315-*a* (e.g., by increasing current density in the conductor portion 335-*a* of an applied current). For example, the conductor portion 335-*a* may be narrower along the x-direction than the operative pad 315-*a* and the probe pad 330-*a*, or thinner along the z-direction than the operative pad 315-*a* and the probe pad 330-*a*, or both.

In some examples, one or more material properties of the conductor portion 335-*a*, the operative pad 315-*a*, and the probe pad 330-*a* may support disconnecting the probe pad 330-*a* from the operative pad 315-*a* (e.g., by melting the conductor portion 335-*a*). For example, a conductive material of the conductor portion 335-*a* may be different than a conductive material of one or both of the operative pad 315-*a* and the probe pad 330-*a*. Additionally, or alternatively, a resistivity of the conductor portion 335-*a* may be greater than a resistivity of the operative pad 315-*a* and the probe pad 330-*a*, which may concentrate ohmic heating at the conductor portion 335-*a* during current application.

By disconnecting the probe pad 330-*a* from the operative pad 315-*a*, capacitive effects of the probe pad 330-*a* on the signal path 320 that is coupled with the operative pad 315-*a* may be reduced (e.g., reducing a net capacitance associated with the signal path 320), thereby improving the ability of the signal path 320 to support high-frequency operations.

Figure 5:
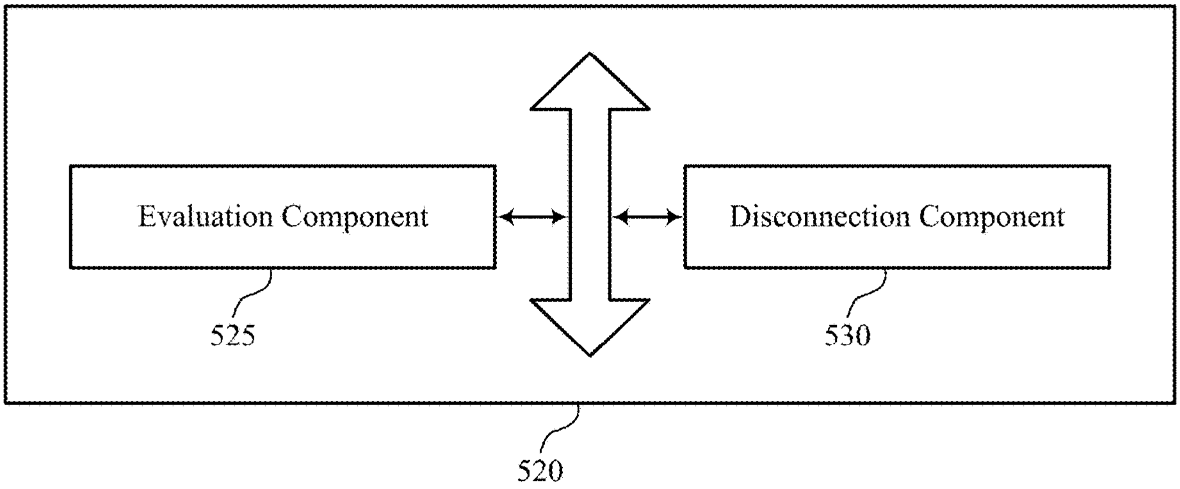
FIG. 5 shows a block diagram of an evaluation system that supports probe pad disconnection for high-speed memory system interfaces in accordance with examples as disclosed herein.

FIG. 5 shows a block diagram 500 of an evaluation system 520 that supports probe pad disconnection for high-speed memory system interfaces in accordance with examples as disclosed herein. The evaluation system 520 may be configured to perform evaluation and disconnection techniques as described with reference to FIGS. 1 through 4. The evaluation system 520, or various components thereof, may be an example of means for performing various aspects of probe pad disconnection for high-speed memory system interfaces as described herein. For example, the evaluation system 520 may include an evaluation component 525, a disconnection component 530, or any combination thereof. Each of these components, or components of subcomponents thereof (e.g., one or more processors, one or more memories), may communicate, directly or indirectly, with one another (e.g., via one or more buses).

The evaluation component 525 may be configured as or otherwise support a means for evaluating operations of a semiconductor component. The semiconductor component may include a memory array, circuitry configured for accessing the memory array, a first conductive pad at a surface of the semiconductor component and coupled with the circuitry configured for accessing the memory array, and a second conductive pad (e.g., a probe pad) at the surface of the semiconductor component and electrically connected with the first conductive pad via a conductor portion. In some implementations, the evaluating may be based at least in part on signaling communicated via the second conductive pad. The disconnection component 530 may be configured as or otherwise support a means for electrically disconnecting the second conductive pad from the first conductive pad based at least in part on breaking an electrical continuity through the conductor portion after the evaluating.

In some examples, to support breaking the electrical continuity through the conductor portion, the disconnection component 530 may be configured as or otherwise support a means for melting least a portion of the conductor portion based at least in part on applying a current through the conductor portion.

In some examples, to support breaking the electrical continuity through the conductor portion, the disconnection component 530 may be configured as or otherwise support a means for melting least a portion of the conductor portion based at least in part on applying a laser to the conductor portion.

In some examples, before the disconnecting, a third cross-sectional area of the conductor portion is less than a first cross-sectional area of the first conductive pad and less than a second cross-sectional area of the second conductive pad.

In some examples, before the disconnecting, the first conductive pad, and the second conductive pad include a contiguous conductor material.

In some examples, the first conductive pad and the second conductive pad include a first material and the conductor portion includes a second material that is different than the first material.

In some examples, evaluating the operations includes evaluating operations of the memory array, operations of the circuitry configured for accessing the memory array, or both.

In some examples, evaluating the operations is associated with deforming a surface of the second conductive pad based at least in part on a probe contacting the second conductive pad.

In some examples, the described functionality of the evaluation system 520, or various components thereof, may be supported by or may refer to at least a portion of at least one processor, where such at least one processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the evaluation system 520, or various components thereof, may be implemented at least in part by instructions (e.g., stored in memory, non-transitory computer-readable medium) executable by such at least one processor.

Figure 6:
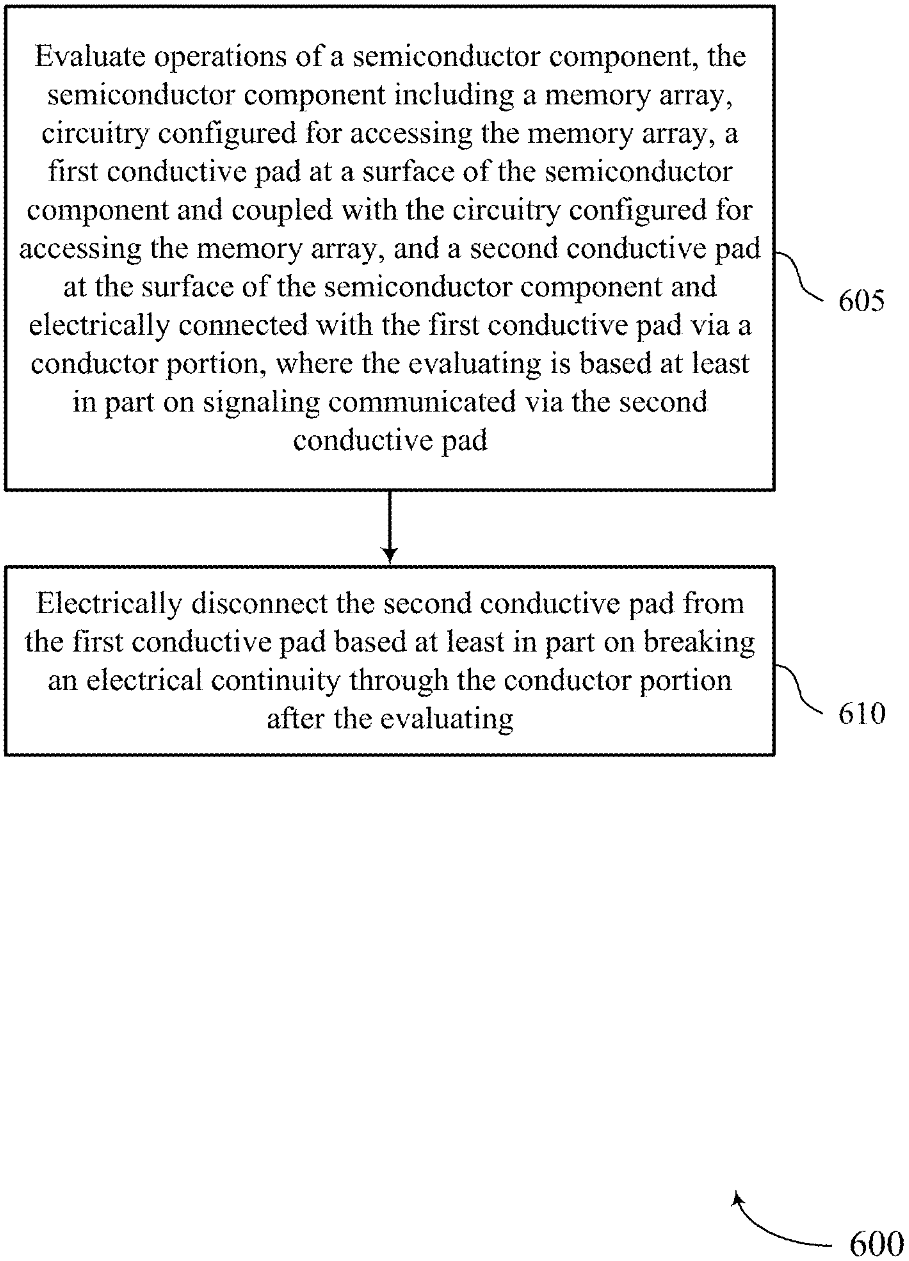
FIG. 6 shows a flowchart illustrating a method or methods that support probe pad disconnection for high-speed memory system interfaces in accordance with examples as disclosed herein.

FIG. 6 shows a flowchart illustrating a method 600 that supports probe pad disconnection for high-speed memory system interfaces in accordance with examples as disclosed herein. The operations of method 600 may be implemented by an evaluation system or its components as described herein. For example, the operations of method 600 may be performed by an evaluation system as described with reference to FIGS. 1 through 5. In some examples, an evaluation system may execute a set of instructions to control the functional elements of the device to perform the described functions. Additionally, or alternatively, the evaluation system may perform aspects of the described functions using special-purpose hardware.

At 605, the method may include evaluating operations of a semiconductor component, the semiconductor component including a memory array, circuitry configured for accessing the memory array, a first conductive pad at a surface of the semiconductor component and coupled with the circuitry configured for accessing the memory array, and a second conductive pad at the surface of the semiconductor component and electrically connected with the first conductive pad via a conductor portion, where the evaluating is based at least in part on signaling communicated via the second conductive pad. In some examples, aspects of the operations of 605 may be performed by an evaluation component 525 as described with reference to FIG. 5.

At 610, the method may include electrically disconnecting the second conductive pad from the first conductive pad based at least in part on breaking an electrical continuity through the conductor portion after the evaluating. In some examples, aspects of the operations of 610 may be performed by a disconnection component 530 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for evaluating operations of a semiconductor component, the semiconductor component including a memory array, circuitry configured for accessing the memory array, a first conductive pad at a surface of the semiconductor component and coupled with the circuitry configured for accessing the memory array, and a second conductive pad at the surface of the semiconductor component and electrically connected with the first conductive pad via a conductor portion, where the evaluating is based at least in part on signaling communicated via the second conductive pad and electrically disconnecting the second conductive pad from the first conductive pad based at least in part on breaking an electrical continuity through the conductor portion after the evaluating.

Aspect 2: The method, apparatus, or non-transitory computer-readable medium of aspect 1, where breaking the electrical continuity through the conductor portion includes operations, features, circuitry, logic, means, or instructions, or any combination thereof for melting least a portion of the conductor portion based at least in part on applying a current through the conductor portion.

Aspect 3: The method, apparatus, or non-transitory computer-readable medium of any of aspects 1 through 2, where breaking the electrical continuity through the conductor portion includes operations, features, circuitry, logic, means, or instructions, or any combination thereof for melting least a portion of the conductor portion based at least in part on applying a laser to the conductor portion.

Aspect 4: The method, apparatus, or non-transitory computer-readable medium of any of aspects 1 through 3, where before the disconnecting, a third cross-sectional area of the conductor portion is less than a first cross-sectional area of the first conductive pad and less than a second cross-sectional area of the second conductive pad.

Aspect 5: The method, apparatus, or non-transitory computer-readable medium of any of aspects 1 through 4, where before the disconnecting, the first conductive pad, and the second conductive pad include a contiguous conductor material.

Aspect 6: The method, apparatus, or non-transitory computer-readable medium of any of aspects 1 through 5, where the first conductive pad and the second conductive pad include a first material and the conductor portion includes a second material that is different than the first material.

Aspect 7: The method, apparatus, or non-transitory computer-readable medium of any of aspects 1 through 6, where evaluating the operations includes evaluating operations of the memory array, operations of the circuitry configured for accessing the memory array, or both.

Aspect 8: The method, apparatus, or non-transitory computer-readable medium of aspect 7, where evaluating the operations is associated with deforming a surface of the second conductive pad based at least in part on a probe contacting the second conductive pad.

It should be noted that the aspects described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 9: An apparatus, including: a memory array of a semiconductor component; circuitry of the semiconductor component that is configured for accessing the memory array; a first conductive pad at a surface of the semiconductor component and electrically connected with the circuitry configured for accessing the memory array; and a second conductive pad at the surface of the semiconductor component and electrically disconnected from the first conductive pad via a molten disconnection region of a conductor portion between the first conductive pad and the second conductive pad.

Aspect 10: The apparatus of aspect 9, where: the first conductive pad and a first portion of the conductor portion include a first contiguous portion of a conductive material; and the second conductive pad and a second portion of the conductor portion include a second contiguous portion of the conductive material.

Aspect 11: The apparatus of any of aspects 9 through 10, where the first conductive pad and the second conductive pad include a first conductor material and the conductor portion includes a second conductor material that is different than the first conductor material.

Aspect 12: The apparatus of any of aspects 9 through 11, where a third width of the conductor portion along the surface of the semiconductor component is less than a first width of the first conductive pad along the surface of the semiconductor component and less than a second width of the second conductive pad along the surface of the semiconductor component.

Aspect 13: The apparatus of any of aspects 9 through 12, where the first conductive pad has a first cross-sectional area at the surface of the semiconductor component and the second conductive pad has a second cross-sectional area at the surface of the semiconductor component that is different than the first cross-sectional area.

Aspect 14: The apparatus of any of aspects 9 through 13, where the molten disconnection region includes an opened electrical connection of a fuse.

Aspect 15: The apparatus of any of aspects 9 through 14, where the first conductive pad is configured for coupling with a second component to convey command signaling, data signaling, clock signaling, or any combination thereof between the second component and the circuitry configured for accessing the memory array.

Aspect 16: The apparatus of any of aspects 9 through 15, where the second conductive pad includes a material irregularity indicative of a probe operation.

An apparatus is described. The following provides an overview of aspects of the apparatus as described herein:

Aspect 17: An apparatus, including: a memory array of a semiconductor component; circuitry of the semiconductor component that is configured for accessing the memory array; a first conductive pad at a surface of the semiconductor component and electrically connected with the circuitry configured for accessing the memory array; and a second conductive pad at the surface of the semiconductor component and electrically connected with the first conductive pad via a conductor portion, the conductor portion having a third cross-sectional area that is less than a first cross-sectional area of the first conductive pad and less than a second cross-sectional area of the second conductive pad.

Aspect 18: The apparatus of aspect 17, where the first conductive pad, the second conductive pad, and the conductor portion include a conductor material that is contiguous at the surface of the semiconductor component.

Aspect 19: The apparatus of any of aspects 17 through 18, where the conductor portion includes a first material and the first conductive pad and the second conductive pad include a second material that is different than the first material.

Aspect 20: The apparatus of any of aspects 17 through 19, where the conductor portion is associated with a first resistivity and the first conductive pad and the second conductive pad are associated with a second resistivity that is less than the first resistivity.

Aspect 21: The apparatus of any of aspects 17 through 20, where a third width of the third cross-sectional area along the surface of the semiconductor component is less than a first width of the first cross-sectional area along the surface of the semiconductor component and less than a second width of the second cross-sectional area along the surface of the semiconductor component.

Aspect 22: The apparatus of any of aspects 17 through 21, where a third thickness of the third cross-sectional area from the surface of the semiconductor component is less than a first thickness of the first cross-sectional area from the surface of the semiconductor component and less than a second thickness of the second cross-sectional area from the surface of the semiconductor component.

Aspect 23: The apparatus of any of aspects 17 through 22, where the first conductive pad has a first cross-sectional area at the surface of the semiconductor component and the second conductive pad has a second cross-sectional area at the surface of the semiconductor component that is different than the first cross-sectional area.

Aspect 24: The apparatus of any of aspects 17 through 23, where the first conductive pad is configured for coupling with a second component to convey command signaling, data signaling, clock signaling, or any combination thereof between the second component and the circuitry configured for accessing the memory array.

Aspect 25: The apparatus of any of aspects 17 through 24, where the conductor portion includes a fuse.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms “electronic communication,” “conductive contact,” “connected,” and “coupled” may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. A conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or may be an indirect conductive path that includes intermediate components, such as switches, transistors, or other components. In some examples, the flow of signals between the connected components may be interrupted for a time, for example, using one or more intermediate components such as switches or transistors.

The term “isolated” may refer to a relationship between components in which signals are not presently capable of flowing between the components. Components are isolated from each other if there is an open circuit between them. For example, two components separated by a switch that is positioned between the components are isolated from each other when the switch is open. When a component isolates two components, the component may initiate a change that prevents signals from flowing between the other components using a conductive path that previously permitted signals to flow.

The term “coupling” (e.g., “electrically coupling”) may refer to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component may initiate a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic.

The description set forth herein, in connection with the appended drawings, describes example configurations and does not represent all the examples that may be implemented or that are within the scope of the claims. The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Similar components may be distinguished by following the reference label by one or more dashes and additional labeling that distinguishes among the similar components. If just the first reference label is used in the specification, the description is applicable to any one of the similar components having the same first reference label irrespective of the additional reference labels.

The functions described herein may be implemented in hardware, software executed by a processing system (e.g., one or more processors, one or more controllers, control circuitry processing circuitry, logic circuitry), firmware, or any combination thereof. If implemented in software executed by a processing system, the functions may be stored on or transmitted over as one or more instructions (e.g., code) on a computer-readable medium. Due to the nature of software, functions described herein can be implemented using software executed by a processing system, hardware, firmware, hardwiring, or combinations of any of these. Features implementing functions may be physically located at various positions, including being distributed such that portions of functions are implemented at different physical locations.

Illustrative blocks and modules described herein may be implemented or performed with one or more processors, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or other types of processor. A processor may also be implemented as at least one of one or more computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

Computer-readable media includes both non-transitory computer storage media and communication media including any medium that facilitates transfer of a computer program from one place to another. A non-transitory storage medium may be any available medium, or combination of multiple media, that can be accessed by a computer. By way of example, and not limitation, non-transitory computer-readable media can comprise RAM, ROM, electrically erasable programmable read-only memory (EEPROM), optical disk storage, magnetic disk storage or other magnetic storage devices, or any other non-transitory medium or combination of media that can be used to carry or store desired program code means in the form of instructions or data structures and that can be accessed by a computer, or a processor.

The descriptions and drawings are provided to enable a person having ordinary skill in the art to make or use the disclosure. Various modifications to the disclosure will be apparent to the person having ordinary skill in the art, and the techniques disclosed herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:

a memory array of a semiconductor component;

circuitry of the semiconductor component that is configured for accessing the memory array;

a first conductive pad at a surface of the semiconductor component and electrically connected with the circuitry configured for accessing the memory array; and a second conductive pad at the surface of the semiconductor component and electrically disconnected from the first conductive pad via a molten disconnection region of a conductor portion between the first conductive pad and the second conductive pad, wherein the second conductive pad comprises a material irregularity indicative of a probe operation.

2. The apparatus of claim 1, wherein:

the first conductive pad and a first portion of the conductor portion comprise a first contiguous portion of a conductive material; and the second conductive pad and a second portion of the conductor portion comprise a second contiguous portion of the conductive material.

3. The apparatus of claim 1, wherein the first conductive pad and the second conductive pad comprise a first conductor material and the conductor portion comprises a second conductor material that is different than the first conductor material.

4. The apparatus of claim 1, wherein a third width of the conductor portion along the surface of the semiconductor component is less than a first width of the first conductive pad along the surface of the semiconductor component and less than a second width of the second conductive pad along the surface of the semiconductor component.

5. The apparatus of claim 1, wherein the molten disconnection region comprises an opened electrical connection of a fuse.

6. The apparatus of claim 1, wherein the first conductive pad is configured for coupling with a second component to convey command signaling, data signaling, clock signaling, or any combination thereof between the second component and the circuitry configured for accessing the memory array.

7. A method, comprising:

evaluating operations of a semiconductor component, the semiconductor component including a memory array, circuitry configured for accessing the memory array, a first conductive pad at a surface of the semiconductor component and coupled with the circuitry configured for accessing the memory array, and a second conductive pad at the surface of the semiconductor component and electrically connected with the first conductive pad via a conductor portion, wherein evaluating the operations of the semiconductor component is based at least in part on signaling communicated via the second conductive pad and is associated with deforming a surface of the second conductive pad based at least in part on a probe contacting the second conductive pad; and electrically disconnecting the second conductive pad from the first conductive pad based at least in part on breaking an electrical continuity through the conductor portion after evaluating the operations of the semiconductor component.

8. The method of claim 7, wherein breaking the electrical continuity through the conductor portion comprises:

melting at least a portion of the conductor portion based at least in part on applying a current through the conductor portion.

9. The method of claim 7, wherein breaking the electrical continuity through the conductor portion comprises:

melting at least a portion of the conductor portion based at least in part on applying a laser to the conductor portion.

10. The method of claim 7, wherein evaluating the operations comprises evaluating operations of the memory array, operations of the circuitry configured for accessing the memory array, or both.

11. An apparatus, comprising:

a memory array of a semiconductor component;

circuitry of the semiconductor component that is configured for accessing the memory array;

a first conductive pad at a surface of the semiconductor component and electrically connected with the circuitry configured for accessing the memory array; and a second conductive pad at the surface of the semiconductor component and electrically connected with the first conductive pad via a conductor portion, the conductor portion having a third cross-sectional area that is less than a first cross-sectional area of the first conductive pad and less than a second cross-sectional area of the second conductive pad, wherein the conductor portion is associated with a first resistivity and the first conductive pad and the second conductive pad are associated with a second resistivity that is less than the first resistivity.

12. The apparatus of claim 11, wherein the first conductive pad, the second conductive pad, and the conductor portion comprise a conductor material that is contiguous at the surface of the semiconductor component.

13. The apparatus of claim 11, wherein the conductor portion comprises a first material and the first conductive pad and the second conductive pad comprise a second material that is different than the first material.

14. The apparatus of claim 11, wherein a third width of the third cross-sectional area along the surface of the semiconductor component is less than a first width of the first cross-sectional area along the surface of the semiconductor component and less than a second width of the second cross-sectional area along the surface of the semiconductor component.

15. The apparatus of claim 11, wherein the first conductive pad is configured for coupling with a second component to convey command signaling, data signaling, clock signaling, or any combination thereof between the second component and the circuitry configured for accessing the memory array.

16. The apparatus of claim 11, wherein the conductor portion comprises a fuse.

17. An apparatus comprising:

a memory array of a semiconductor component;

circuitry of the semiconductor component that is configured for accessing the memory array;

a first conductive pad at a surface of the semiconductor component and electrically connected with the circuitry configured for accessing the memory array; and a second conductive pad at the surface of the semiconductor component and electrically connected with the first conductive pad via a conductor portion, the conductor portion having a third cross-sectional area that is less than a first cross-sectional area of the first conductive pad and less than a second cross-sectional area of the second conductive pad, wherein a third thickness of the third cross-sectional area from the surface of the semiconductor component is less than a first thickness of the first cross-sectional area from the surface of the semiconductor component and less than a second thickness of the second cross-sectional area from the surface of the semiconductor component.

18. The apparatus of claim 17, wherein the first conductive pad, the second conductive pad, and the conductor portion comprise a conductor material that is contiguous at the surface of the semiconductor component.

19. The apparatus of claim 17, wherein the conductor portion comprises a first material and the first conductive pad and the second conductive pad comprise a second material that is different than the first material.

20. The apparatus of claim 17, wherein a third width of the third cross-sectional area along the surface of the semiconductor component is less than a first width of the first cross-sectional area along the surface of the semiconductor component and less than a second width of the second cross-sectional area along the surface of the semiconductor component.

* * * * *